US009720478B2

(12) United States Patent
Hanafusa

(10) Patent No.: US 9,720,478 B2
(45) Date of Patent: Aug. 1, 2017

(54) STORAGE BATTERY MONITORING METHOD, STORAGE BATTERY MONITORING SYSTEM, AND STORAGE BATTERY SYSTEM

(71) Applicant: Panasonic Corporation, Osaka (JP)

(72) Inventor: Hiroshi Hanafusa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 227 days.

(21) Appl. No.: 14/117,641

(22) PCT Filed: Mar. 18, 2013

(86) PCT No.: PCT/JP2013/001829
§ 371 (c)(1),
(2) Date: Nov. 14, 2013

(87) PCT Pub. No.: WO2013/140781
PCT Pub. Date: Sep. 26, 2013

(65) Prior Publication Data
US 2014/0089692 A1    Mar. 27, 2014

(30) Foreign Application Priority Data
Mar. 19, 2012  (JP) ................................ 2012-062598

(51) Int. Cl.
*G06F 1/28* (2006.01)
*H01M 10/48* (2006.01)
(Continued)

(52) U.S. Cl.
CPC ........... *G06F 1/28* (2013.01); *G01R 31/3651* (2013.01); *G01R 31/3679* (2013.01);
(Continued)

(58) Field of Classification Search
CPC ....................... G01R 31/3651; G01R 31/3679
See application file for complete search history.

(56) References Cited

U.S. PATENT DOCUMENTS

2002/0120906 A1* 8/2002 Xia ................... G01R 31/3651
716/111
2004/0263123 A1* 12/2004 Breen et al. .................. 320/128
(Continued)

FOREIGN PATENT DOCUMENTS

EP    2 386 754     11/2011
JP    2011-069693    4/2011
(Continued)

OTHER PUBLICATIONS

International Search Report issued May 14, 2013 in International (PCT) Application No. PCT/JP2013/001829.
(Continued)

*Primary Examiner* — Nitin Patel
*Assistant Examiner* — Kevin Stewart
(74) *Attorney, Agent, or Firm* — Wenderoth, Lind & Ponack, L.L.P.

(57) ABSTRACT

A storage battery monitoring method receives identification information indicating a storage battery system and characteristic data of a storage battery, the characteristic data including history information which indicates charging and discharging history of the storage battery; determines, based on the received history information, a deterioration model corresponding to the storage battery from among deterioration models managed in a database, the deterioration models each indicating a relationship between a state of health and a number of charging and discharging cycles performed by the battery as indicated by the charging and discharging history; generates control data for suppressing deterioration of the storage battery at a predetermined point in time according to the corresponding deterioration model; and
(Continued)

transmits the generated control data to cause the storage battery system to control the storage battery.

23 Claims, 13 Drawing Sheets

(51) Int. Cl.
*G01R 31/36* (2006.01)
*H02J 7/04* (2006.01)
*H02J 13/00* (2006.01)
*H04Q 9/00* (2006.01)
*H01M 10/42* (2006.01)
*H02J 3/32* (2006.01)

(52) U.S. Cl.
CPC ............ *H01M 10/48* (2013.01); *H02J 7/045* (2013.01); *H02J 7/047* (2013.01); *H02J 13/0003* (2013.01); *H04Q 9/00* (2013.01); *H01M 2010/4278* (2013.01); *H02J 3/32* (2013.01); *H04Q 2209/10* (2013.01); *H04Q 2209/40* (2013.01)

(56) References Cited

U.S. PATENT DOCUMENTS

| | | | | |
|---|---|---|---|---|
| 2007/0046261 | A1* | 3/2007 | Porebski | G01R 31/3641 320/132 |
| 2008/0059816 | A1* | 3/2008 | Paniagua et al. | 713/300 |
| 2011/0089907 | A1* | 4/2011 | Bhardwaj | G01R 31/3662 320/136 |
| 2011/0161025 | A1* | 6/2011 | Tomura et al. | 702/63 |
| 2011/0196633 | A1 | 8/2011 | Abe et al. | |
| 2011/0248678 | A1* | 10/2011 | Wade | H02J 7/0014 320/119 |
| 2012/0038312 | A1 | 2/2012 | Abe et al. | |
| 2012/0043929 | A1* | 2/2012 | Yazami | 320/107 |
| 2012/0101754 | A1* | 4/2012 | Halme | 702/63 |
| 2012/0210150 | A1* | 8/2012 | de Lind van Wijngaarden | G06F 1/3212 713/320 |
| 2012/0210325 | A1* | 8/2012 | de Lind van Wijngaarden et al. | 718/103 |
| 2012/0223670 | A1 | 9/2012 | Kinjo et al. | |
| 2013/0057223 | A1* | 3/2013 | Lee | H02J 7/0021 320/136 |
| 2013/0069658 | A1* | 3/2013 | Rich et al. | 324/426 |
| 2013/0085696 | A1 | 4/2013 | Xu et al. | |

FOREIGN PATENT DOCUMENTS

| | | |
|---|---|---|
| JP | 2011-075364 | 4/2011 |
| WO | 2011/160258 | 12/2011 |
| WO | 2012-032776 | 3/2012 |

OTHER PUBLICATIONS

European Search Report issued Feb. 20, 2015 in corresponding European Patent Application No. 13764278.1.
Office Action dated May 26, 2017 in corresponding European Application No. 13764278.1.
"Battery Life" In: Gates Energy Products: "Rechargeable Batteries Applications Handbook", Dec. 31, 1991 (Dec. 31, 1991), Butterworth-Heinemann ISBN: 0-7506-9228-6, pp. 109-114.

* cited by examiner

FIG. 3A

| Storage battery ID | Operation date | Connection information | Operation period | Operation details | Amount of charge and discharge | Voltage | Temperature | SOC | SOH |
|---|---|---|---|---|---|---|---|---|---|
| ... | February 1, 2012 | | 1 to 6 a.m. | Charge | 100 C | | 2°C | 80% | 80% |
| | February 1, 2012 | ... | 14 to 17 p.m. | Discharge | 60 C | | 10°C | 65% | 80% |
| | ... | | | ... | ... | ... | ... | ... | ... |
| | February 7, 2012 | | | Capacity learning | | | | | |
| | February 8, 2012 | | | Charge | | | | | |

FIG. 3B

| ID (parent) | ID (child) | Operation date | Operation details | Voltage | Current | Temperature | SOC |
|---|---|---|---|---|---|---|---|
| 01 | 01 | | | | | | |
| | 02 | | | | | | |
| | 03 | | | | | | |
| | ... | ... | ... | ... | ... | ... | ... |
| | N | | | | | | |

STORAGE BATTERY MONITORING METHOD, STORAGE BATTERY MONITORING SYSTEM, AND STORAGE BATTERY SYSTEM

TECHNICAL FIELD

The present invention relates to a storage battery monitoring method, a storage battery monitoring system, and a storage battery system for both managing characteristics of storage batteries and remotely controlling the storage batteries.

BACKGROUND

A technique for estimating deterioration states or abnormal states of storage batteries has been examined so far. For instance, in an information management system described in Patent Literature (PTL) 1, a server manages life information of a storage battery which has reached the end of life. When determining that the storage battery has reached the end of life, the server stores, as the life information, the current usage environment and usage state information of the storage battery in association with each other.

CITATION LIST

Patent Literature

[PTL 1] Japanese Unexamined Patent Application Publication No. 2011-69693

SUMMARY

However, even when a deterioration state of a storage battery is accurately determined, an actual state of progress of the deterioration of the storage battery differs depending on the current deterioration state, operating environment, or operating condition. For this reason, when charging and discharging of the storage battery is not controlled in consideration of the deterioration state of the storage battery, the storage battery is further deteriorated. In addition, it is necessary to control charging and discharging of a storage battery system in consideration of, for example, charge or discharge efficiency of a power conditioner system included in the storage battery system other than the deterioration state.

The present invention is conceived in view of such a problem and has an object to both manage characteristic data of storage batteries and remotely control the storage batteries according to the characteristic data of the storage batteries.

A storage battery monitoring method according to an aspect of the present invention is a storage battery monitoring method including: receiving, via a communication network, identification information indicating a storage battery system and characteristic data of at least one storage battery, the storage battery system including the at least one storage battery, the characteristic data including history information which indicates charging and discharging history of the at least one storage battery; determining, based on the received history information, a deterioration model corresponding to the at least one storage battery from among deterioration models managed in a database, the deterioration models each indicating a relationship between a state of health and a number of charging and discharging cycles performed by the battery as indicated by the charging and discharging history; generating control data for suppressing deterioration of the at least one storage battery at a predetermined point in time according to the corresponding deterioration model; and transmitting, via the communication network, the generated control data to the storage battery system to cause the storage battery system to control the at least one storage battery based on the transmitted control data.

It is to be noted that another aspect of the present invention can be realized not only as such a storage battery monitoring method but also as a storage battery monitoring device which performs, as steps, characteristic means of the storage battery monitoring method, or a program causing a computer to execute such characteristic steps. Such a program can be distributed via a recording medium such as a CD-ROM (Compact Disc Read Only Memory) and a transmission medium such as the Internet.

Furthermore, a further aspect of the present invention can be realized as a semiconductor integrated circuit (LSI) which performs part or all of functions of such a storage battery monitoring device, or a storage battery monitoring system including the storage battery monitoring device.

According to the present invention, it is possible to both monitor a deterioration state of a storage battery and remotely control the storage battery according to the deterioration state of the storage battery.

BRIEF DESCRIPTION OF DRAWINGS

FIG. 3A shows exemplary data stored in a memory of the controller according to Embodiment 1.

FIG. 3B shows another exemplary data stored in the memory of the controller according to Embodiment 1.

Figure 1:
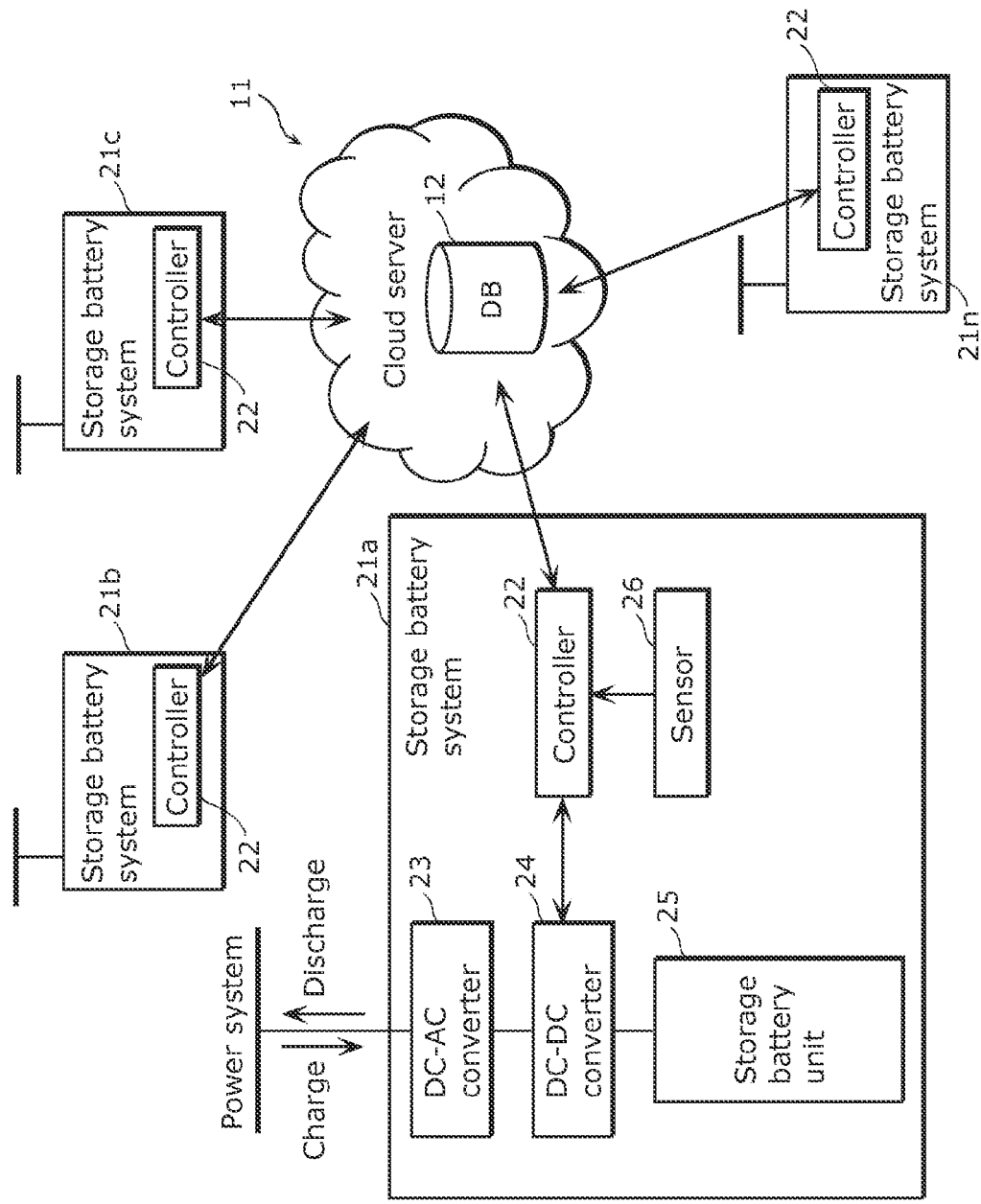
FIG. 1 shows an exemplary system configuration of a storage battery monitoring system according to Embodiment 1.

DETAILED DESCRIPTION (Underlying Knowledge Forming Basis of the Present Invention)

A storage battery deteriorates by being repeatedly charged or discharged. The storage battery becomes unable to charge or discharge desired power as the deterioration of the storage battery progresses. Accordingly, the storage battery needs to be replaced with appropriate timing before the storage battery reaches the end of life.

However, it takes effort for a user to both know a state of the storage battery and operate the storage battery. In addition, it is difficult for a user having insufficient technical knowledge about storage battery to both know the state of the storage battery and operate the storage battery.

Moreover, costs incurred by a controller of a storage battery system increase as the number of times charge and discharge control processing performed by the controller increases.

Furthermore, when a grid operator regulates a voltage or frequency of a grid using a storage battery of each of users, it is desirable to consider a deterioration state of the storage battery of each user, or charge or discharge efficiency of a storage battery system.

In view of this, a storage battery monitoring method according to an aspect of the present invention is a storage battery monitoring method for use in a storage battery monitoring system including (i) a storage battery system including at least one storage battery that charges or discharges power and a control unit that controls the at least one storage battery, and (ii) a server that communicates with the storage battery system via a communication network, the method including: receiving, via the communication network, identification information indicating the storage battery system and characteristic data indicating a state of the at least one storage battery; determining, based on the received characteristic data, a deterioration model corresponding to the at least one storage battery from among deterioration models managed in a database and indicating deterioration tendencies of other storage batteries; generating, via the communication network, control data for ameliorating a deterioration state of the at least one storage battery at a predetermined point in time according to the corresponding deterioration model; transmitting the generated control data to the storage battery system; and controlling, in the storage battery system, the at least one storage battery based on the transmitted control data.

For instance, the characteristic data may include at least one of output power, a voltage, a temperature, and a state of charge of the at least one storage battery.

For example, the storage battery monitoring method may include transmitting control data for decreasing an amount of charge to be returned to the at least one storage battery when charging, in the case where the deterioration model corresponding to the at least one storage battery has a deterioration level less than a predetermined threshold value.

For instance, the storage battery monitoring method may include transmitting control data for decreasing output power of the at least one storage battery, in the case where the deterioration model corresponding to the at least one storage battery has a deterioration level less than a predetermined threshold value.

For example, the storage battery monitoring method may include transmitting control data for deactivating the at least one storage battery, in the case where the deterioration model corresponding to the at least one storage battery has a deterioration level less than a predetermined threshold value.

For instance, the storage battery monitoring method may include registering, into the database, the deterioration model corresponding to the at least one storage battery, in the case where the deterioration models managed in the database include no deterioration model similar to the deterioration model corresponding to the at least one storage battery.

For example, the storage battery monitoring method may include determining, based on the received characteristic data of the at least one storage battery, whether or not the at least one storage battery is in an abnormal state, using error models managed in the database and indicating characteristics when the other storage batteries are abnormal, and notifying a predetermined notification unit when the at least one storage battery is in the abnormal state.

For instance, the storage battery system may include a plurality of the storage batteries, and the storage battery monitoring method may include transmitting the control data about each of the storage batteries.

For example, the storage battery monitoring method may include transmitting control data for increasing output power for a less-deteriorated storage battery among the storage batteries and decreasing output power for a more-deteriorated storage battery among the storage batteries.

For instance, a plurality of the storage battery systems may be connected, and the storage battery monitoring method may include: generating the control data about each of the storage battery systems; and transmitting the control data to each of the storage battery systems.

Moreover, a storage battery monitoring system according to an embodiment of the present invention is a storage battery monitoring system including (i) a storage battery system including at least one storage battery that charges or discharges power and a control unit that controls the at least one storage battery, and (ii) a server that communicates with the storage battery system via a communication network, wherein the server: receives, via the communication network, identification information indicating the storage battery system and characteristic data indicating a state of the at least one storage battery; determines, based on the received characteristic data, a deterioration model corresponding to the at least one storage battery from among deterioration models managed in a database and indicating deterioration tendencies of other storage batteries; generates, via the communication network, control data for ameliorating a deterioration state of the at least one storage battery at a predetermined point in time according to the corresponding deterioration model; and transmits the generated control data to the storage battery system, and the storage battery system controls the at least one storage battery based on the transmitted control data.

Furthermore, the present invention may be realized as a storage battery system used for the storage battery monitoring system.

A storage battery system according to another embodiment of the present invention includes: at least one storage battery that charges or discharges power; a monitoring unit configured to monitor a state of the at least one storage battery; and a control unit configured to (i) transmit, to a storage battery monitoring device connected via a communication network, identification information indicating the storage battery system and characteristic data indicating the state of the at least one storage battery, (ii) receive, from the storage battery monitoring device via the communication network, control data for ameliorating a deterioration state of the at least one storage battery at a predetermined point in time according to a deterioration model corresponding to the at least one storage battery, and (iii) control the at least one storage battery based on the received control data, wherein the storage battery monitoring device determines, based on the characteristic data, the deterioration model corresponding to the at least one storage battery from among deterioration models managed in a database and indicating deterioration tendencies of other storage batteries, and the control of the at least one storage battery based on the control data is control for decreasing a voltage applied to the at least one storage battery when the at least storage battery is charging or decreasing a current passing through the at least one storage battery when the at least one storage battery discharging.

The following describes in detail embodiments of the present invention with reference to drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents.

Therefore, among the structural elements in the following exemplary embodiments, structural elements not recited in any one of the independent claims are described as arbitrary structural elements.

Embodiment 1

[1. Configuration]
(1.1 System Configuration Diagram)

FIG. 1 shows an exemplary system configuration of a storage battery monitoring system according to Embodiment 1. In FIG. 1, a cloud server 11 and storage battery systems 21a, 21b, 21c, . . . , 21n (also collectively written as a "storage battery system 21") are connected via a communication network.

The storage battery system 21 includes a controller 22, a DC-AC converter 23 (also referred to as an "inverter"), a DC-DC converter 24, a storage battery unit 25, and a sensor 26, for instance.

Hereinafter, the DC-AC converter 23 or the DC-AC converter 23 and the DC-DC converter 24 are collectively referred to as a power conditioner system (hereinafter, "PCS 27" for the sake of shorthand).

Although this embodiment describes, as an example, a case where one storage battery unit 25 is provided in the storage battery system 21 in FIG. 1, the present invention is not limited to this embodiment. In other words, storage battery units 25 may be provided in the storage battery system 21.

The storage battery unit 25 includes at least one storage battery (not shown). A connection configuration of the at least one storage battery is not particularly limited. For instance, when storage batteries are present, a connection configuration of the storage batteries may be series connection or parallel connection, or a combination of the series connection and the parallel connection.

Although elements other than the controllers 22 are omitted for the storage battery systems 21b to 21n for the sake of shorthand in FIG. 1, it is assumed that each of the storage battery systems 21b to 21n has the same configuration as the storage battery system 21a.

The controller 22 obtains an identification number of the at least one storage battery included in the storage battery unit 25 and control information at a time of charging or discharging each of the at least one storage battery, and transmits the identification number and the control information to the cloud server 11. The controller 22 also obtains sensor information from the sensor 26, and transmits the obtained sensor information to the cloud server 11.

The sensor information includes, for example, a temperature and a humidity for each storage battery, a temperature and a humidity for each of storage battery units 25, a temperature of a casing of the storage battery system 21, an outdoor temperature, an outdoor humidity, a temperature of other elements such as the DC-AC converter (inverter) 23, a voltage and a current at an output terminal for each of storage battery cells or groups, a humidity in the casing of the storage battery unit 25, and a gas composition.

The controller 22 transmits, to the cloud server 11, history information about charging and discharging of the storage battery unit 25, based on the obtained control information or sensor information. The history information may be managed on a storage battery cell or unit basis.

The cloud server 11 includes a database (written as "DB" in FIG. 1) 12 which manages information obtained from each storage battery system 21.

The database 12 manages the control information and sensor information received from each controller 22 or the history information in association with identification information of each storage battery system 21. The database 12 may manage these information items for each of the storage batteries included in the respective storage battery systems 21.

The cloud server 11 determines an operation policy for each storage battery system 21 according to a deterioration state of the storage battery system 21. The cloud server 11 notifies the respective storage battery systems 21 of the determined operation policies. It is to be noted that the operation policy is control data for controlling operations of the storage battery system 21 or the at least one storage battery included in the storage battery system 21.

The operation policy includes, for example, a state of charge, an amount of power discharged, and an amount of power charged of the storage battery included in each storage battery system 21, and a voltage and a current at a time of charging or discharging. Moreover, the operation policy may be an operation plan in which these information items are scheduled for predetermined times.

Furthermore, the operation policy may not define a control plan for each storage battery. To put it another way, the operation policy may relate to the entire storage battery system 21. In this case, the controller 22 included in the storage battery system 21 may determine how each of the storage batteries included in the respective storage battery systems 21 is controlled.

(1.2 Functional Block Diagram of the Controller 22)

Figure 2:
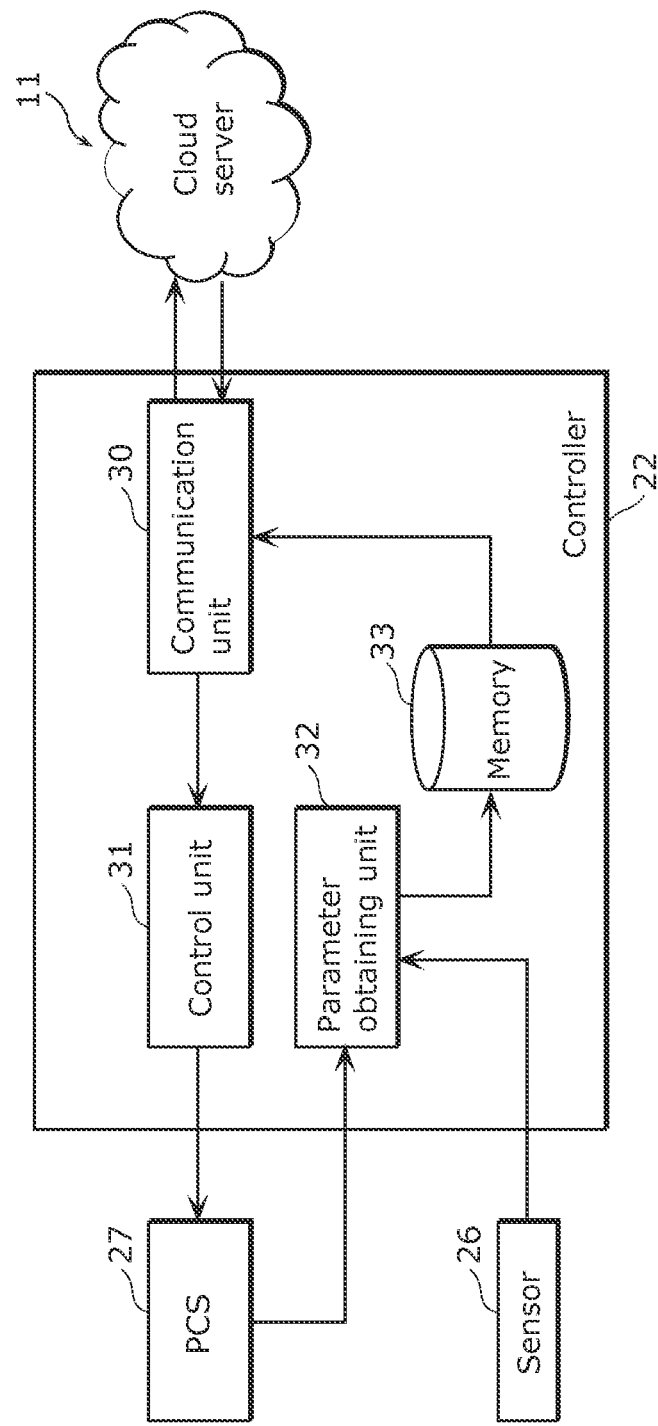
FIG. 2 is a functional block diagram of a controller included in a storage battery system according to Embodiment 1.

FIG. 2 is a functional block diagram of the controller 22 included in the storage battery system 21.

The controller 22 includes a communication unit 30, a control unit 31, a parameter obtaining unit 32, and a memory 33.

The communication unit 30 communicates with the cloud server 11 through a communication network. This communication network may be wired connection or wireless connection, or a combination of the wired connection and the wireless connection. Upon reception of the user ID and the operation policy of each storage battery from the cloud server 11, the communication unit 30 notifies the control unit 31 of the user ID and the operation policy.

The control unit 31 controls charging or discharging for each storage battery unit 25 or each storage battery (cell) included in the storage battery unit 25, based on the operation policy received from the cloud server 11. It is possible to simplify a control plan for or specifications of the control unit 31 by designing the cloud server 11 to determine a deterioration state of each storage battery included in the storage battery unit 25 and an operation policy.

For instance, the control unit 31 determines an amount of charge and discharge for each storage battery included in the storage battery unit 25 based on a predetermined operation policy, and notifies the PCS 27 of timing for or the amount of charge and discharge of the storage battery.

After that, when a change of the operation policy is notified by the cloud server 11, the control unit 31 notifies the PCS 27 of the changed operation policy.

The operation policy may be changed by the control unit 31 in accordance with a control instruction value of the cloud server 11 or by rewriting firmware of the control unit 31, for instance.

The PCS 27 causes each storage battery to charge or discharge based on the operation policy notified by the control unit 31.

The parameter obtaining unit 32 obtains the control information at the time of charging or discharging which the PCS 27 notified the storage battery unit 25 of and the sensor information transmitted from the sensor 26. The parameter obtaining unit 32 accumulates, as history information, the obtained control information and sensor information.

The control information includes a storage battery ID or operation details (a date, an amount of charge and discharge, and a time of charging or discharging) of each storage battery, for example. Moreover, when the storage battery units 25 are connected, connection information indicating which of the storage battery units 25 each storage battery is connected to may be included in the control information.

It is to be noted that although this embodiment has described the case where the control information is obtained from the PCS 27, the control information is not necessarily obtained from the PCS 27, and a detecting unit which detects the control information may be provided separately. In this case, the parameter obtaining unit 32 may obtain the control information from the detecting unit.

The history information accumulated in the memory 33 is transmitted to the cloud server 11 through the communication unit 30. For instance, (i) every time information is accumulated in the memory 33, the history information is transmitted from the memory 33 (ii) with predetermined timing, (iii) in response to a request from the cloud server 11. Here, the user ID of the storage battery system 21 may be added to the history information, and such history information may be transmitted.

(1.3 Exemplary Information Stored in the Memory 33)

Figure 3B:
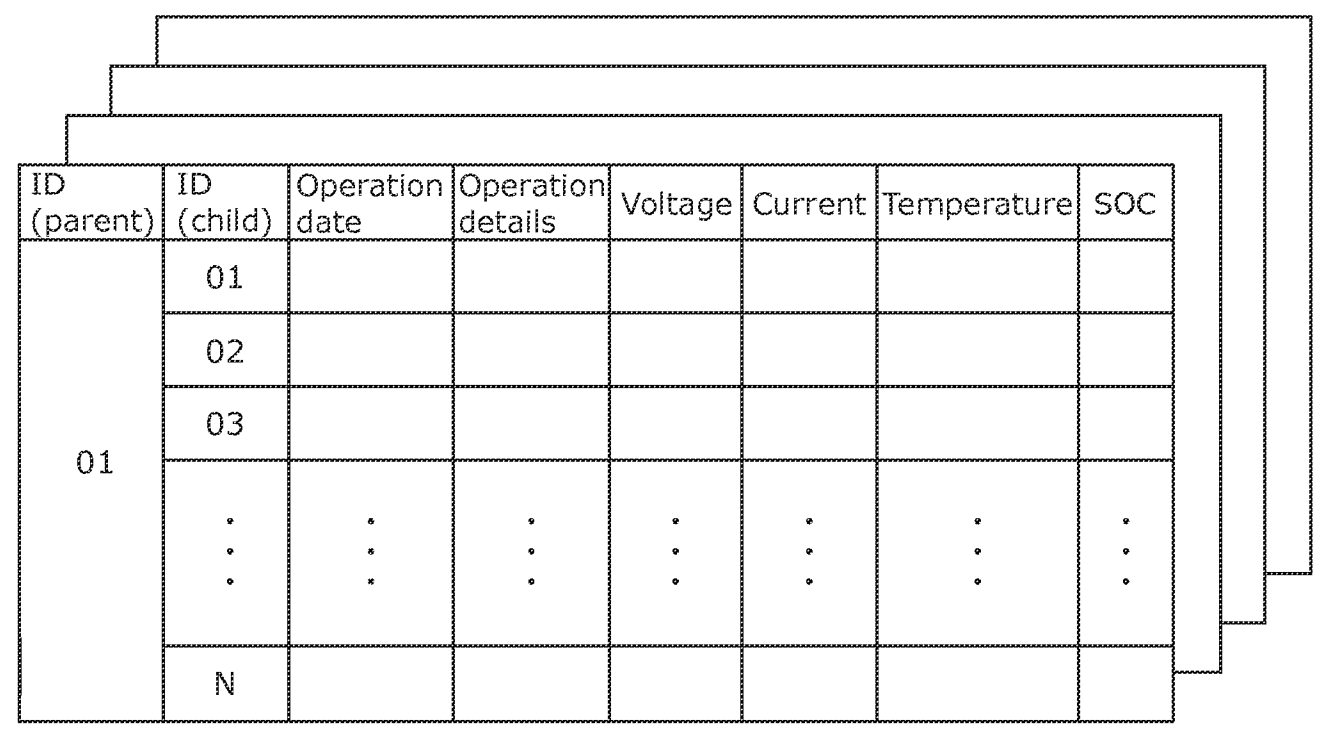

FIG. 3A and FIG. 3B each show exemplary data stored in the memory 33 included in the controller 22. Identification information, control information, and sensor information of a storage battery are accumulated in the memory 33 in association with each other. These information items may be managed for each storage battery unit 25 as shown in FIG. 3A or for each storage battery included in the storage battery unit 25 as shown in FIG. 3B.

In the case of FIG. 3A and FIG. 3B, an example is shown where "storage battery ID," "operation date," "connection information (a unit to which a storage battery belongs)," "operation period," "operation details," "amount of charge and discharge," "temperature," "state of charge (SCO)," and "state of health (SOH)" are stored in the memory 33. However, parameters stored in the memory 33 are not limited to this example. Not all these parameters are necessarily stored. In addition, parameters other than the parameters may be stored.

(1.4 Functional Block Diagram of the Cloud Server 11)

Figure 4:
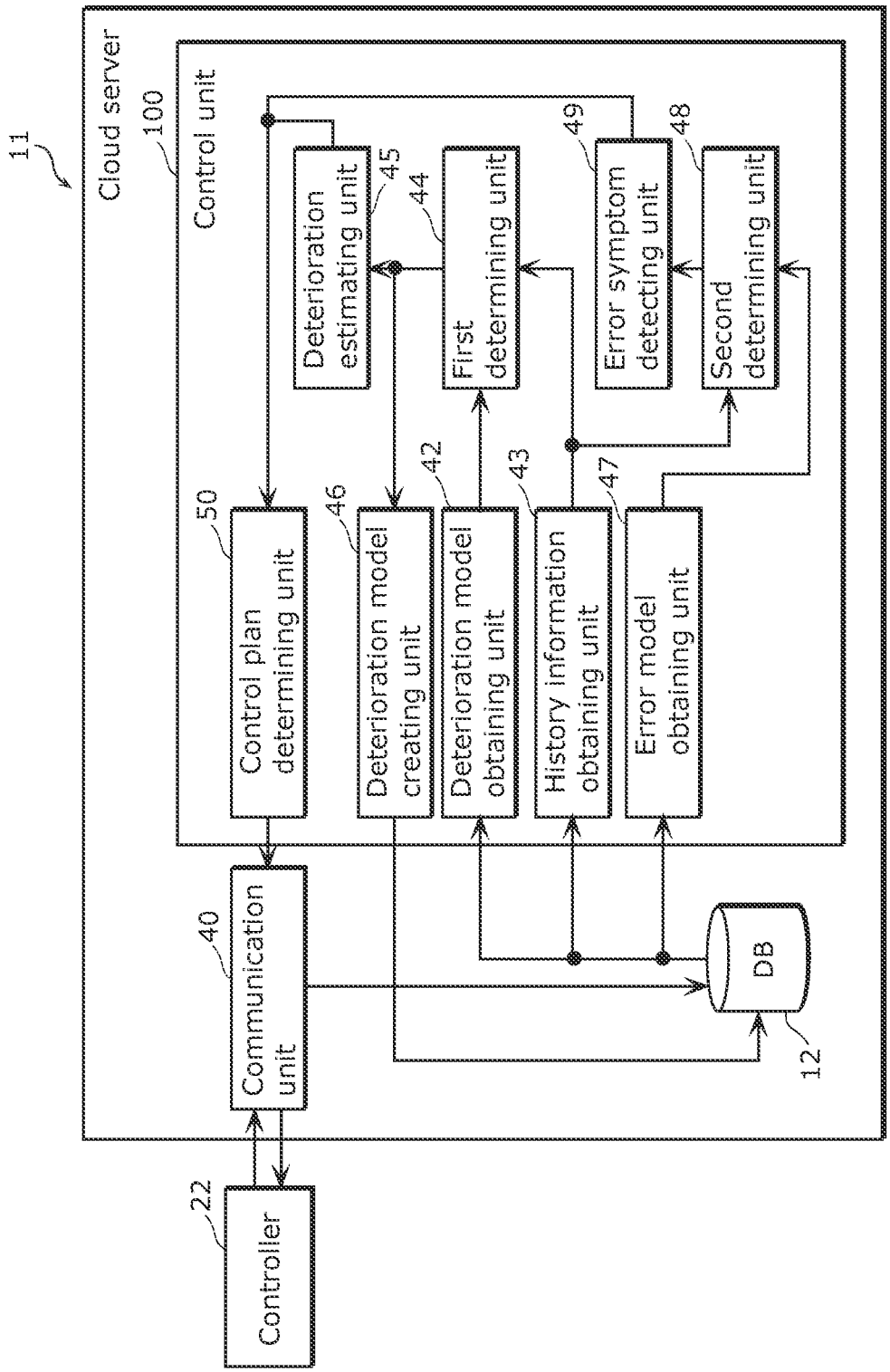
FIG. 4 is a functional block diagram of a cloud server according to Embodiment 1.

FIG. 4 is a functional block diagram of the cloud server 11 according to Embodiment 1 of the present invention.

The cloud server 11 includes: a communication unit 40 which communicates with the controller 22; a database 12 (storage unit) which accumulates information received by the communication unit 40; and a control unit 100.

Control information and sensor information of a storage battery which have been transmitted from the controller 22 since the beginning of use of each storage battery system 21 to the present are accumulated as history information of the storage battery.

Moreover, a deterioration model to be an index for determining a deterioration state of storage battery and an error model to be an index for detecting an abnormal operation of the storage battery are stored in the database 12.

The control unit 100 includes a deterioration model obtaining unit 42, a history information obtaining unit 43, a first determining unit 44, a deterioration estimating unit 45, a deterioration model generating unit 46, an error model obtaining unit 47, a second determining unit 48, an error symptom detecting unit 49, and a control plan determining unit 50.

The configuration of the control unit 100 shown in FIG. 4 is an example, and does not necessarily include all of the functions. The control unit 100 includes at least a function to estimate a deterioration state of a storage battery and a function to determine an operation policy for the storage battery based on the estimated deterioration state.

Moreover, a method for estimating deterioration of a storage battery or a method for detecting abnormality and malfunction of a storage battery is not limited to the following method, and any conventionally-known method is applicable.

Each or part of the functions of the control unit 100 may be executed by a CPU, for instance.

The deterioration model obtaining unit 42 obtains a storage battery deterioration model accumulated in the database 12.

The history information obtaining unit 43 obtains, from the database 12, history information of a storage battery to be diagnosed. For example, an SOH of the storage battery is obtained as the history information.

The first determining unit 44 determines a similarity level between the history information on the SOH obtained by the history information obtaining unit 43 and the deterioration model obtained by the deterioration model obtaining unit 42.

For instance, when deterioration models are stored in the database 12, the first determining unit 44 extracts, from the deterioration models, a deterioration model having a similarity level less than or equal to an acceptable value. When not extracting the deterioration model having the similarity level less than or equal to the acceptable value, the first determining unit 44 notifies the deterioration model generating unit 46 that no matching deterioration model is available.

The deterioration estimating unit 45 estimates a deterioration state of the storage battery based on the deterioration model extracted by the first determining unit 44, and notifies the control plan determining unit 50 of the estimated deterioration state.

The deterioration model generating unit 46 generates a new deterioration model based on the history information of the storage battery, and accumulates the generated new deterioration model in the database 12.

The deterioration model obtaining unit 47 obtains an error model of a storage battery accumulated in the database 12.

This embodiment defines, for example, "error" as a storage battery performing an abnormal operation or a hazardous operation. An error model is created based on voltage characteristics or temperature characteristics of a storage battery, for instance. This embodiment describes, as an example, a case where a voltage model is used as shown in FIG. 6.

The second determining unit 48 determines a similarity level between an error model and the history information of the storage battery to be diagnosed which is obtained by the history information obtaining unit 43. The database 12 includes error models, and the second determining unit 48 extracts, from the error models, an error model having a similarity level relative to the history information less than or equal to an acceptable value.

Figure 6:
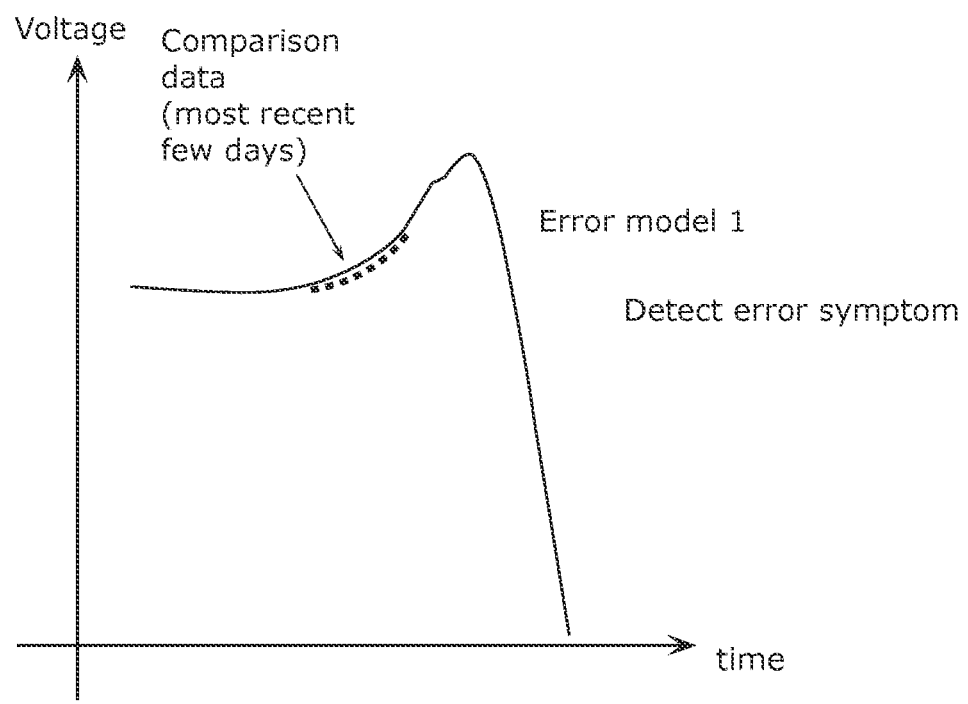
FIG. 6 is a conceptual diagram for illustrating a method for evaluating a similarity level of an error model.

Here, since, as shown in FIG. 6, it is possible to determine an error symptom of a storage battery based only on the most recent storage battery data, the second determining unit 48 is capable of determining a similarity level with an error model using only the most recent voltage data included in history information of the storage battery. With this, it is possible to reduce a data processing time more than a case where an error is detected using all data.

The error symptom detecting unit 49 detects an error of the storage battery to be diagnosed, based on the similar error model. When detecting the error of the storage battery, the error symptom detecting unit 49 notifies the control plan determining unit 50 of the error.

The control plan determining unit 50 creates an operation policy for the storage battery according to the deterioration state of the storage battery estimated by the deterioration model generating unit 46. The control plan determining unit 50 notifies the controller 22 of the operation policy through the communication unit 40.

Moreover, for instance, when the error symptom detecting unit 49 notifies the control plan determining unit 50 of the error symptom of the storage battery, the control plan determining unit creates an operation policy for disusing the storage battery, and notifies the controller 22 of the operation policy through the communication unit 40.

(1.5 Exemplary Data Stored in the Database 12)

Figure 5:
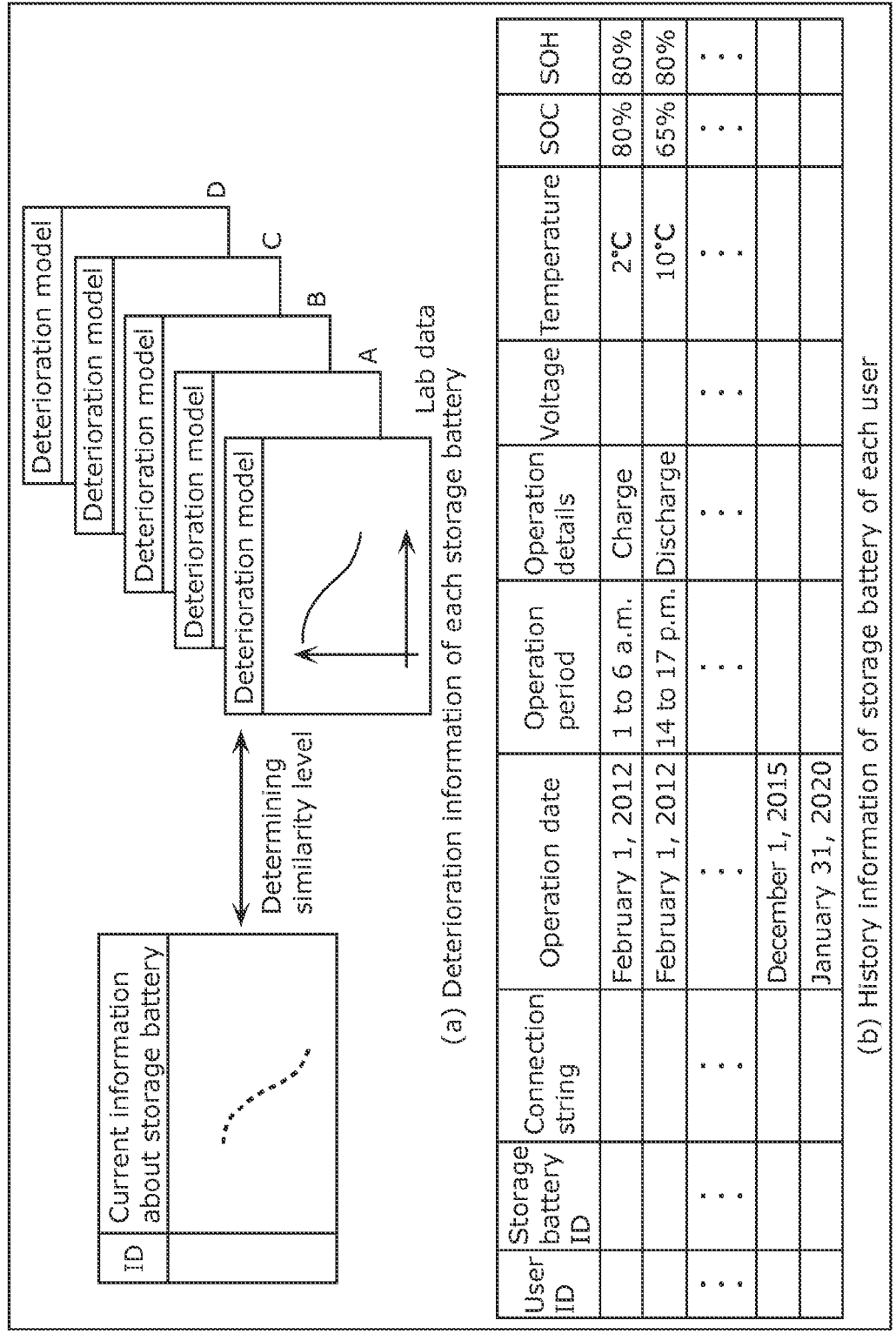
FIG. 5 shows exemplary data stored in a database of the cloud server according to Embodiment 1.

FIG. 5 is exemplary data stored in the database 12 of the cloud server 11 according to Embodiment 1.

The database 12 stores storage battery deterioration models ((a) in FIG. 105) and history information of each storage battery ((b) in FIG. 5).

As shown by (a) in FIG. 5, the database 12 stores standard deterioration models to be indexes for determining a deterioration state of a storage battery. The standard deterioration models may be set by storage battery manufacturers, for instance.

Each storage battery deteriorates differently because an SOH of the storage battery changes depending on an operation state or usage environment of the storage battery. For this reason, the deterioration model generating unit 46 calculates an SOH of each storage battery from history information of the storage battery, generates a deterioration model for the storage battery by modeling a relationship between the SOH and the number of charges and discharges of the storage battery, and stores the deterioration model into the database 12.

With this, it is possible to predict, based on the number of charges and discharges of the storage battery, the number of charges and discharges (period) which allows the storage battery to operate safely and is less than the SOH.

Storage batteries with similar operating environments and operating conditions generally have similar deterioration patterns, and storage batteries with different operating environments and operating conditions have dissimilar deterioration patterns. For this reason, the similar deterioration patterns are generated as one deterioration model, and the dissimilar deterioration patterns are generated as one different (separate) deterioration model.

Moreover, the database 12 may store an error model as shown in FIG. 6.

(1.6 Method for Evaluating Similarity Level of Deterioration Model)

Figure 7:
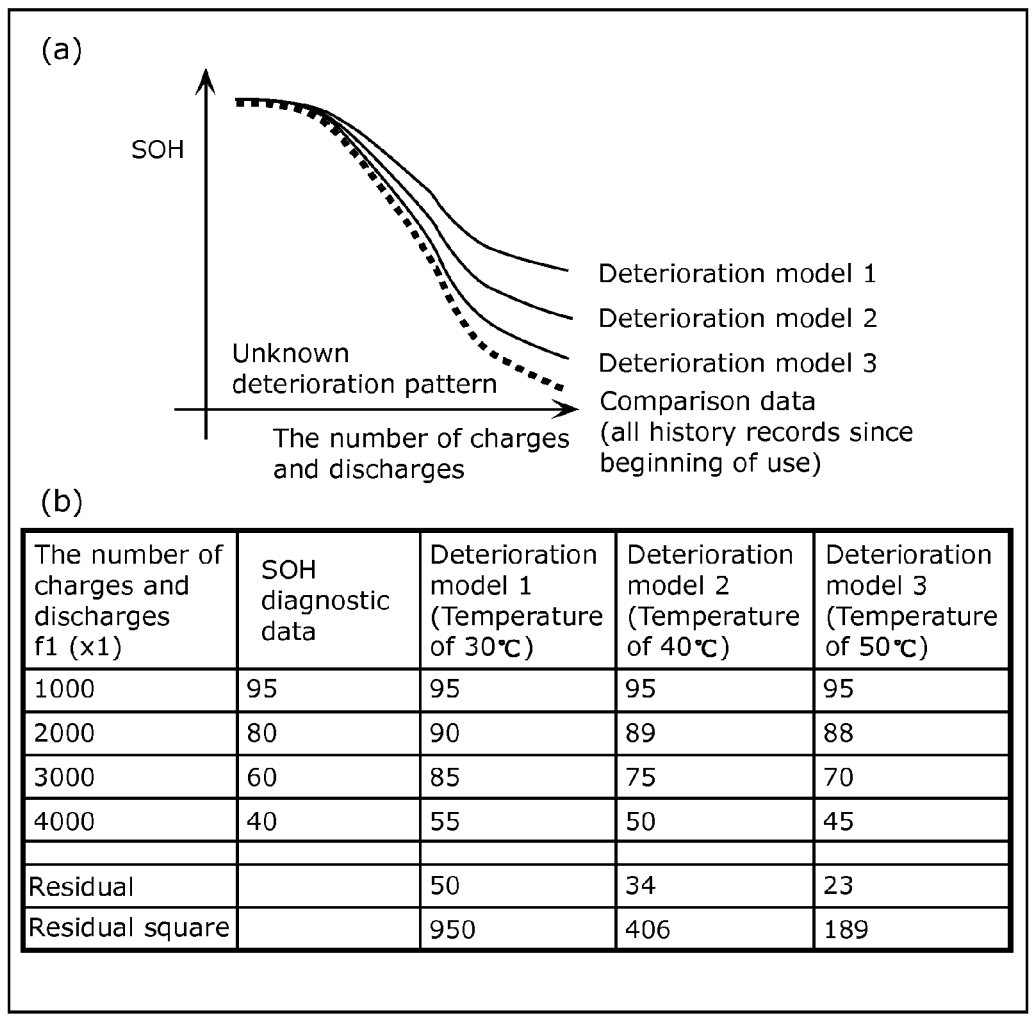
FIG. 7 is a conceptual diagram for illustrating a method for evaluating a similarity level of a deterioration model.

FIG. 7 is a diagram for illustrating a method for evaluating a similarity level of a deterioration model.

(a) in FIG. 7 shows storage battery deterioration models when the vertical axis and the horizontal axis represent an SOH and the number of charges and discharges, respectively. All history records since the beginning of use of storage batteries may be used or history information on an SOH may be used at predetermined intervals. In (a) in FIG. 7, an SOH of comparison data and each deterioration model are indicated by a broken line and a solid line, respectively. Each of the three deterioration models shows, as an example, a case of a different temperature condition.

(b) in FIG. 7 shows each data that is plotted in (a) in FIG. 7.

As stated above, the storage batteries have the dissimilar deterioration patterns depending on the operating environments and operating conditions, and thus this can be represented by an approximation model having an n number of factors as in Equation 1.

$$y = f_1(x_1) + f_2(x_2) + f_3(x_3) + \ldots + f_n(x_n) \quad \text{(Equation 1)}$$

Examples of values used for the factors of Equation 1 include the number of charges and discharges, an SOC, and a temperature. For this reason, a more accurate deterioration model can be created by associating obtained all information items and the SOH.

In FIG. 7, it is assumed that deterioration models having temperatures as parameters relative to an SOH calculated for each of the numbers of charges and discharges are a deterioration model 1 (temperature of 30 degrees Celsius), a deterioration model 2 (temperature of 40 degrees Celsius), and a deterioration model 3 (temperature of 50 degrees Celsius).

A sum of residual squares of an SOH of each deterioration model is calculated every time charge and discharge are performed 1,000 times, and a deterioration model having the smallest sum of the residual squares is determined as a deterioration model most similar to the SOH of the comparison data.

In this embodiment, a residual square "189" of the deterioration model 3 is smaller than a residual square "950" of the deterioration model 1 and a residual square "406" of the deterioration model 2, and thus the deterioration model 3 can be determined as a deterioration model most similar to data to be diagnosed.

Figure 8:
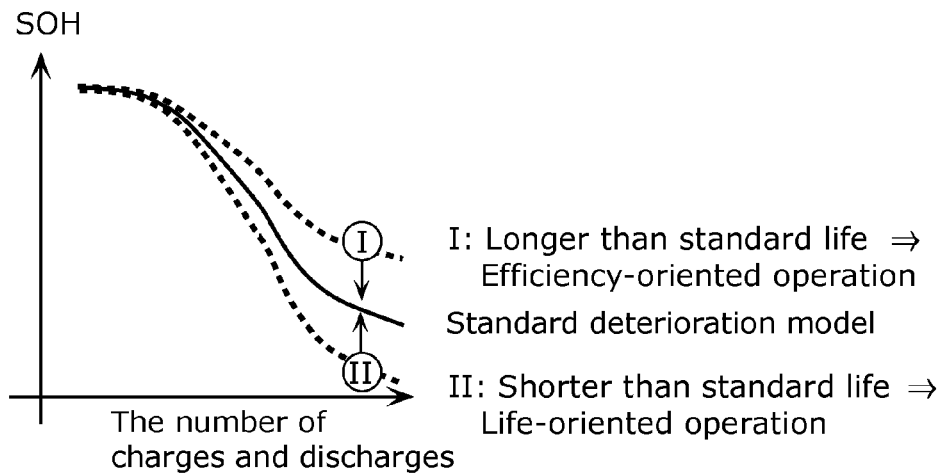
FIG. 8 is a conceptual diagram for illustrating an example when an operation policy of a storage battery is changed.

FIG. 8 is a conceptual diagram for illustrating an example when an operation policy of a storage battery is created. In FIG. 8, a standard deterioration model is indicated by a solid line, and deterioration models (I and II) each calculated from an SOH of the storage battery are indicated by broken lines.

Since the deterioration model I indicates a higher SOH than the standard deterioration model, to increase a return on investment in a storage battery system, it is conceivable that an operation policy for prioritizing economic efficiency even at the sacrifice of a life is adopted.

For instance, it is known that continuously charging a storage battery when its SOC is high accelerates its deterioration. For this reason, the cloud server 11 can suppress the deterioration by predicting power needed by the storage battery system 21 and causing a storage battery to charge power as much as the predicted power immediately before the storage battery discharges.

However, when a prediction error occurs, performing such charge control does not allow the necessary power to be charged, which creates a possibility of purchasing commercial power in a period of time when power price is high. Moreover, for example, when power trading ends in failure because the necessary power cannot be charged, a user loses earnings.

In regard to the storage battery system 21 determined as having a higher SOH than the standard deterioration model, it is possible to reduce the possibility of the lost earnings by causing the storage battery to charge more power than the predicted amount of charge and discharge.

On the other hand, as with the deterioration model II, when it is determined that the SOH of the deterioration model of the storage battery is lower than that of the standard deterioration model, an operation policy for prioritizing the life of the storage battery can be adopted.

For instance, contrary to the case of the deterioration model I, a control method for causing a storage battery to charge power as much as or less than a predicted power immediately before the storage battery discharges can be adopted.

Although the exemplary case where the operation policy is determined has been described with reference to FIG. 8, it goes without saying that a method for determining an operation policy is not limited to this case. The cloud server 11 can determine an operation policy (control method) for a storage battery from various conventionally known standpoints while considering a deterioration state of the storage battery.

For example, when the storage battery unit 25 includes storage batteries, it is possible to create an operation policy for equalizing an SOC of each of the storage batteries. create an operation policy for decreasing an amount of charge and discharge to be returned to or a charge and discharge time of the storage battery. Moreover, in this case, the cloud server 11 may create an operation policy for deactivating the storage battery.

As above, the various methods for determining an operation policy for a storage battery based on a deterioration state of the storage battery can be applied.

The following describes operations of the storage battery monitoring system thus configured, the cloud server 11, and the storage battery system 21.

[2. Operations]
(2.1 Entire Sequence)

Figure 9:
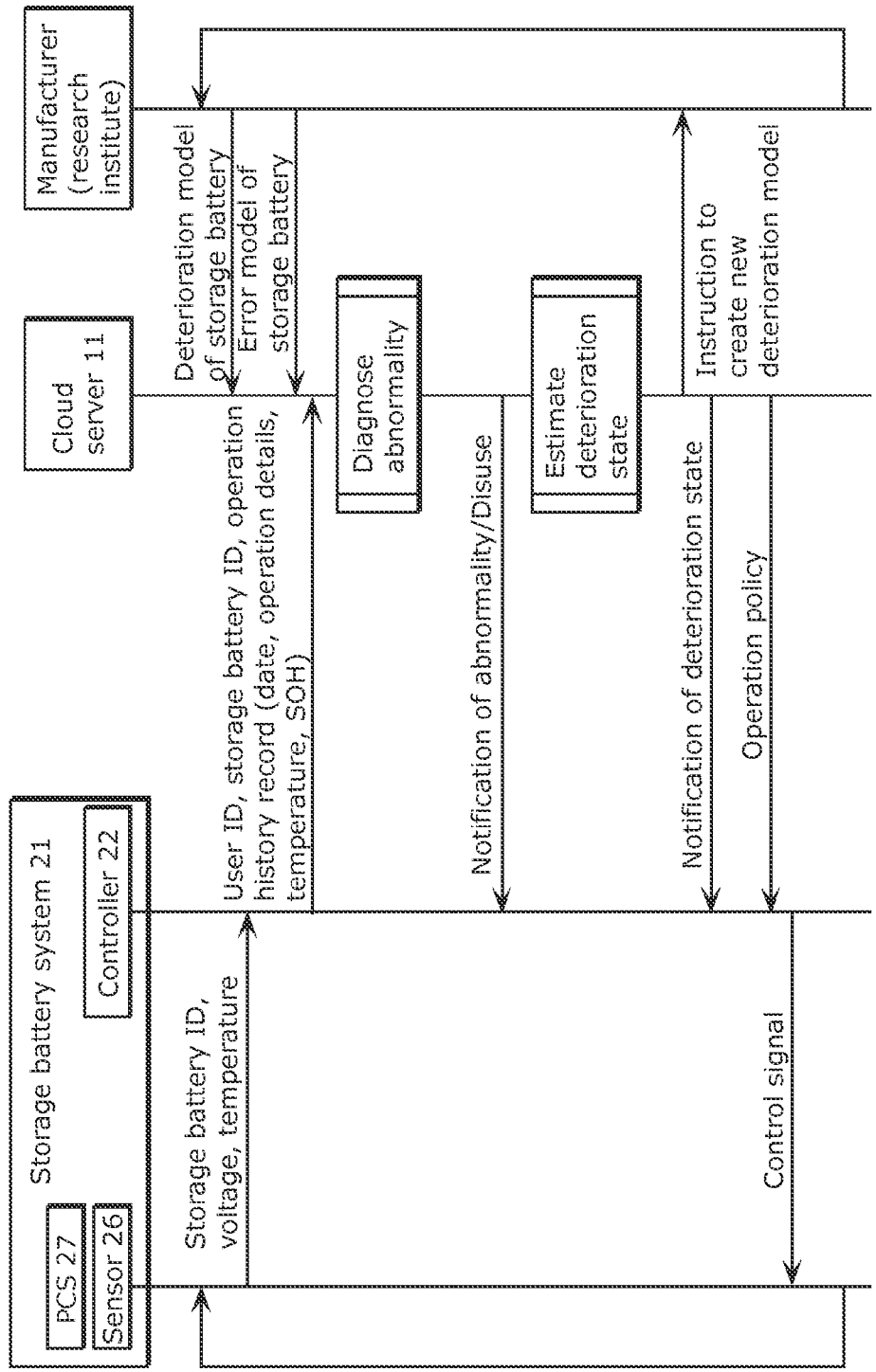
FIG. 9 is a sequence diagram showing flows of information between a storage battery system and a cloud server according to Embodiment 1.

FIG. 9 is a sequence diagram showing flows of information between the storage battery system 21 and the cloud server 11 according to Embodiment 1.

The PCS 27 or the sensor 26 of the storage battery system 21 transmits charge and discharge control information 28 and sensor information 29 of a storage battery, to the controller 22.

The controller 22 adds, to the received control information 28 and sensor information 29, a user ID of the storage battery system 21, an ID of the storage battery, a time, and so on, and transmits the control information 28 and the sensor information 29 to the cloud server 11.

Standard deterioration models and error models created by a manufacturer or the like are previously accumulated in the cloud server 11.

The cloud server 11 compares received history information of the storage battery and the error models, to perform abnormality diagnosis. When finding abnormality, the cloud server 11 notifies the controller 22 of the abnormality, and instructs the controller 11 to take steps for disuse where necessary.

The controller 22 notifies a user of a symptom of the abnormality, and takes steps for disuse according to the instruction from the cloud server 11. A means to notify a user is not particularly limited, and every means such as audio, display on a monitory, and e-mail notification is applied.

When finding no abnormality, the cloud server 11 performs deterioration diagnosis of the storage battery. The cloud server 11 extracts a corresponding deterioration model based on a similarity level or the like, and estimates a deterioration state of the storage battery from the extracted deterioration model. At this time, the cloud server 11 changes an operation policy according to progress of a deterioration of the storage battery. The cloud server 11 transmits, to the controller 22, an operation policy determined for each storage battery.

Moreover, when the cloud server 11 cannot extract the corresponding deterioration model, the cloud server 11 instructs the storage battery manufacturer to create a new deterioration model. The cloud server 11 does not have to send a notification to the manufacturer, and may create a new deterioration model based on the history information of the storage battery.

The controller 22 controls charging or discharging of each storage battery based on the operation policy. At this time, when the operation policy is changed, the controller 22 determines an amount of charge and discharge of each storage battery based on the changed operation policy.

(2.2 Operations of the Cloud Server 11)

Figure 10:
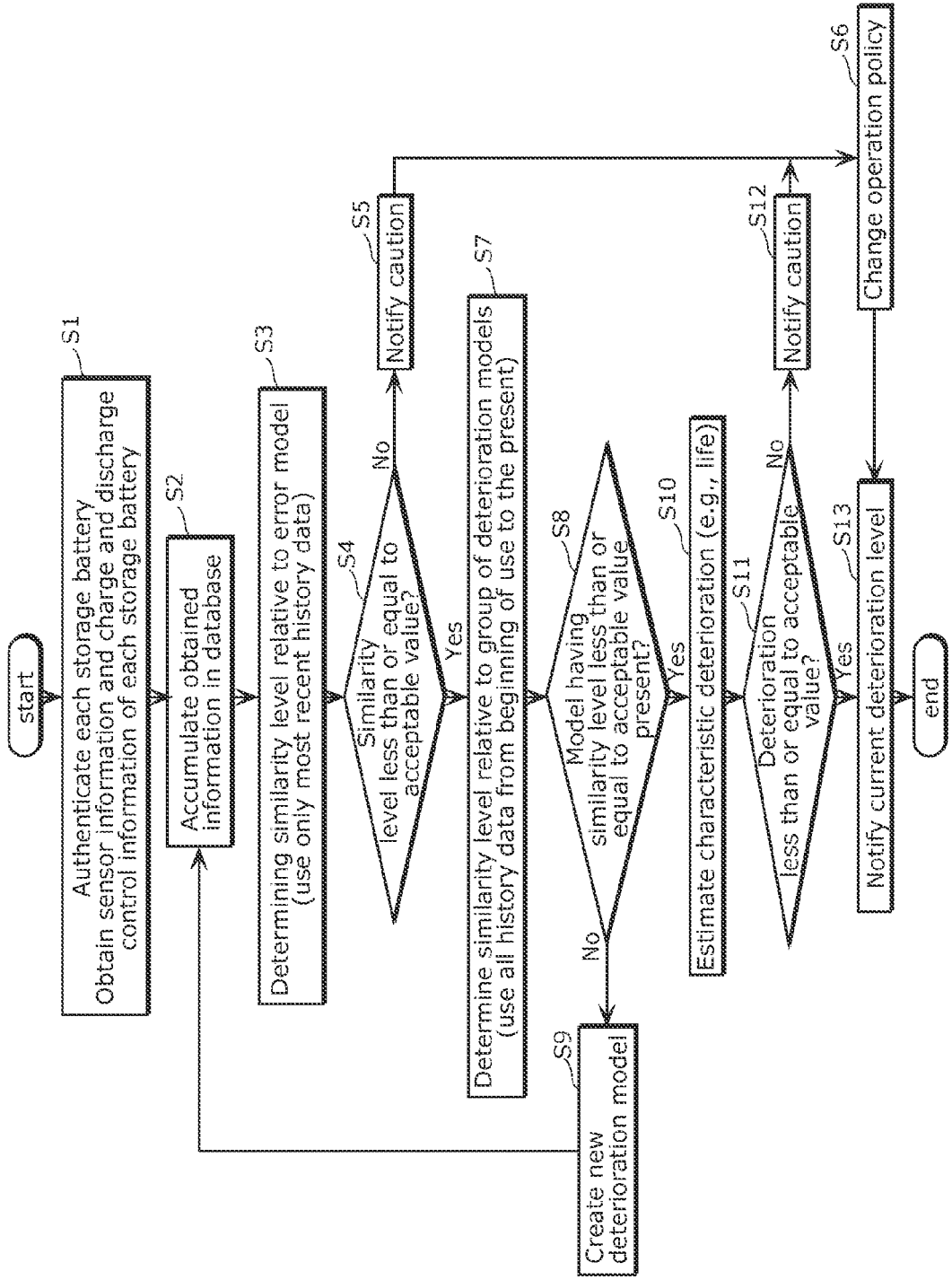
FIG. 10 is a flow chart showing operations of the cloud server according to Embodiment 1.

FIG. 10 is a flow chart showing operations of the cloud server 11 according to Embodiment 1.

After authenticating a storage battery using identification information of the storage battery, the cloud server 11 obtains, from the controller 22, control information at a time of charging and discharging the storage battery and sensor information detected by the sensor 26 (S1). At this time, user authentication may be performed using a user ID of the storage battery.

After accumulating the obtained information in the database 12 (S2), the cloud server 11 detects abnormality and malfunction of the storage battery using operation history information of the storage battery and error models (S3). The operation history information is voltage data, temperature information, or the like, for instance. Here, by using the most recent operation data, it is possible to reduce a time required for error detection.

When the operation history information is similar to an error model (No in S4), the cloud server 11 determines that the storage battery has a symptom of error, and notifies caution (S5). The notified destination of the caution may be the controller 22, a user (a mobile terminal or a display device such as a TV of the user), or a maintenance company. After this, the cloud server 11 changes an operation policy of the storage battery (S6).

On the other hand, when the operation history information of the storage battery is not similar to any accumulated error model (Yes in S4), the cloud server 11 determines that the storage battery has no symptom of error and goes on to estimate a deterioration state of the storage battery.

The cloud server 11 calculates a similarity level between history information on an SOH obtained from the controller 22 and a deterioration model (S7), and determines whether or not the similarity level is less than or equal to a predetermined acceptable value (S8). When the deterioration model having the similarity level less than or equal to the predetermined acceptable value cannot be extracted (No in S8), a new deterioration model is created based on the history information of the storage battery (S9) and accumulated in the database 12 (from S9 to S2). For example, the cloud server 11 creates a deterioration model using the history information on an SOH of a storage battery.

On the other hand, when the deterioration model having the similarity level less than or equal to the predetermined acceptable value is present among the deterioration models accumulated in the database 12 (Yes in S8), the deterioration state of the storage battery is estimated from this deterioration model (S10).

The cloud server 11 instructs the controller 22 to notify caution and change an operation policy, according to the deterioration state of the storage battery. Although FIG. 10 shows an example where when the estimated deterioration state is less than or equal to an acceptable value (No in S11), the caution is notified (S12), and the operation policy is changed, this embodiment is not limited to this case. For instance, the scope of this embodiment includes changing, even when a deterioration state of a storage battery is less than or equal to an acceptable value, an operation policy in consideration of a deterioration state of another storage battery.

When the estimated deterioration state is less than or equal to the acceptable value (Yes in S11), the cloud server 11 notifies the controller 22 of the deterioration state of the storage battery (S13).

It is to be noted that in the above processing, the cloud server 11 can change a frequency of detecting a symptom of error using error models and a frequency of estimating a deterioration state using deterioration models.

For example, it is important to detect a symptom of error early for safety operation of a storage battery system. Consequently, the error detection is performed using the most recent history information of the storage battery in a short cycle such as every hour and every day. In contrast, when a state of the storage battery does not change significantly, the estimation of the deterioration state may be performed at a frequency such as once a month.

As described above, according to this embodiment, the cloud server 11 manages the deterioration states or lives of the storage battery systems 21 and remotely controls each of the storage battery systems 21 according to the deterioration state of each storage battery system 21.

It is to be noted that a control target of the cloud server 11 may be each of the storage battery units 25 included in the storage battery system 21 or each of the storage batteries included in the respective storage battery units 25.

Figure 11:
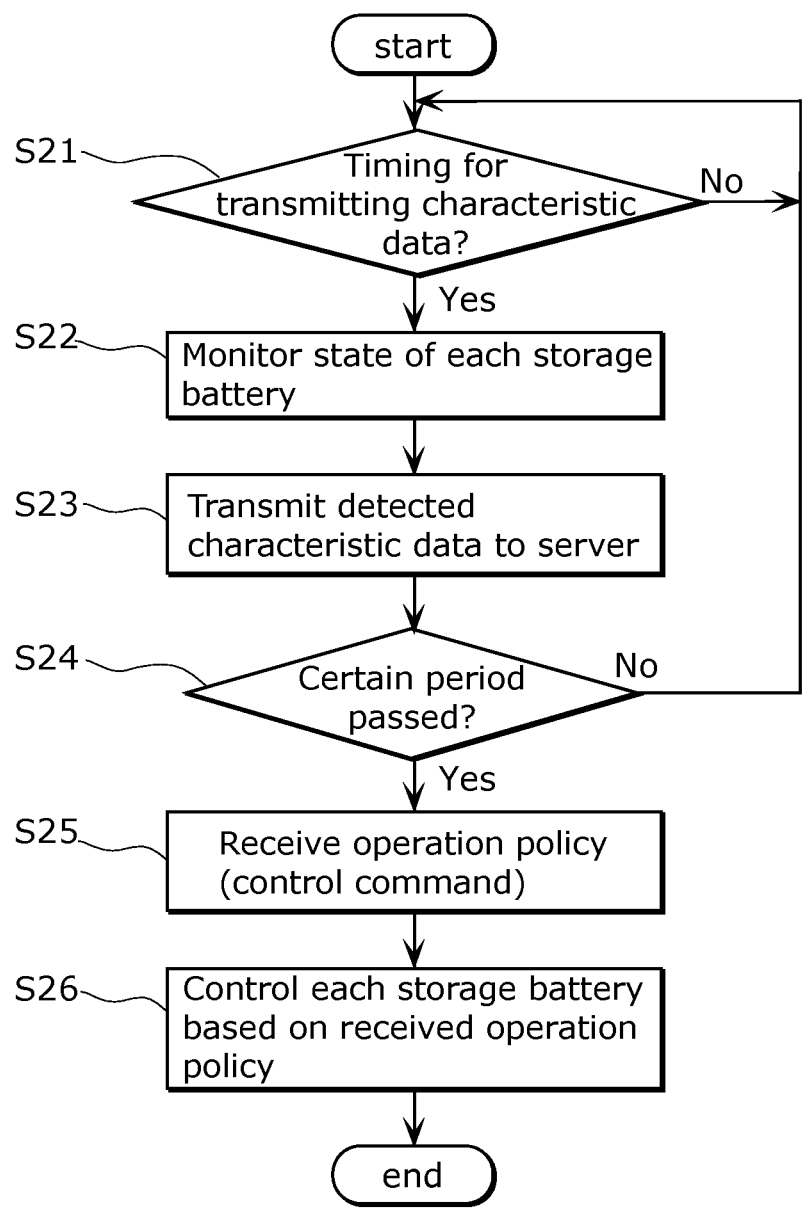
FIG. 11 is a flow chart showing operations of the storage battery system according to Embodiment 1.

FIG. 11 is a flow chart showing operations of a storage battery system according to Embodiment 1.

First, when predetermined timing for transmitting characteristic data to a server comes (Yes in S21), the storage battery system 21 detects characteristic data of a storage battery included in each of the storage battery units 25 (S22).

The characteristic data is data detected by the sensor 26, for instance. Examples of the data include a temperature of each storage battery, a temperature of each storage battery units 25, an outdoor temperature and an outdoor humidity of the storage battery system 21, a temperature of other elements such as the DC-AC converter (inverter) 23, and a voltage and a current at an output terminal for each of storage battery cells or groups.

The predetermined timing is, for instance, a predetermined time everyday, once a week, or once a month, and is not particularly limited.

Next, the storage battery system 21 transmits the characteristic data detected in S22 to the server 11 (S23).

The processes of S21 to S23 are repeated until a certain period of time passes (No in S24).

When the certain period of time has passed in S24 (Yes in S24), the storage battery system 21 receives an operation policy of the storage battery system 21 from the server 11 (S25). This operation policy is an amount of charge of each storage battery and a control command including information about the maximum output power at a time of charging and discharging or the like, for example.

The certain period of time is, for instance, a predetermined time everyday, once a week, or once a month, and is not particularly limited.

Next, the storage battery system 21 controls charging or discharging of each of the storage batteries included in the respective storage battery units 25, based on the operation policy received from the server 11 (S26).

This operation policy may include control information for each of the storage batteries included in the respective storage battery units 25, or may be control information for the storage battery system 21. In the latter case, the controller 22 of the storage battery system 21 may determine a control plan for each of the storage batteries included in the respective storage battery units 25.

It is to be noted that the timing for transmitting characteristic data to the server 11 and timing for receiving an operation policy from the server 11 may be variously combined. For example, the storage battery system 21 may transmit characteristic data to the server weekly and receive an operation policy from the server annually, or can transmit the characteristic data to the server daily and receive the operation policy from the server weekly. In addition, the timing and the combination of the timing can be always changed depending on the states of the storage batteries or the like.

Modification of Embodiment 1

Figure 12:
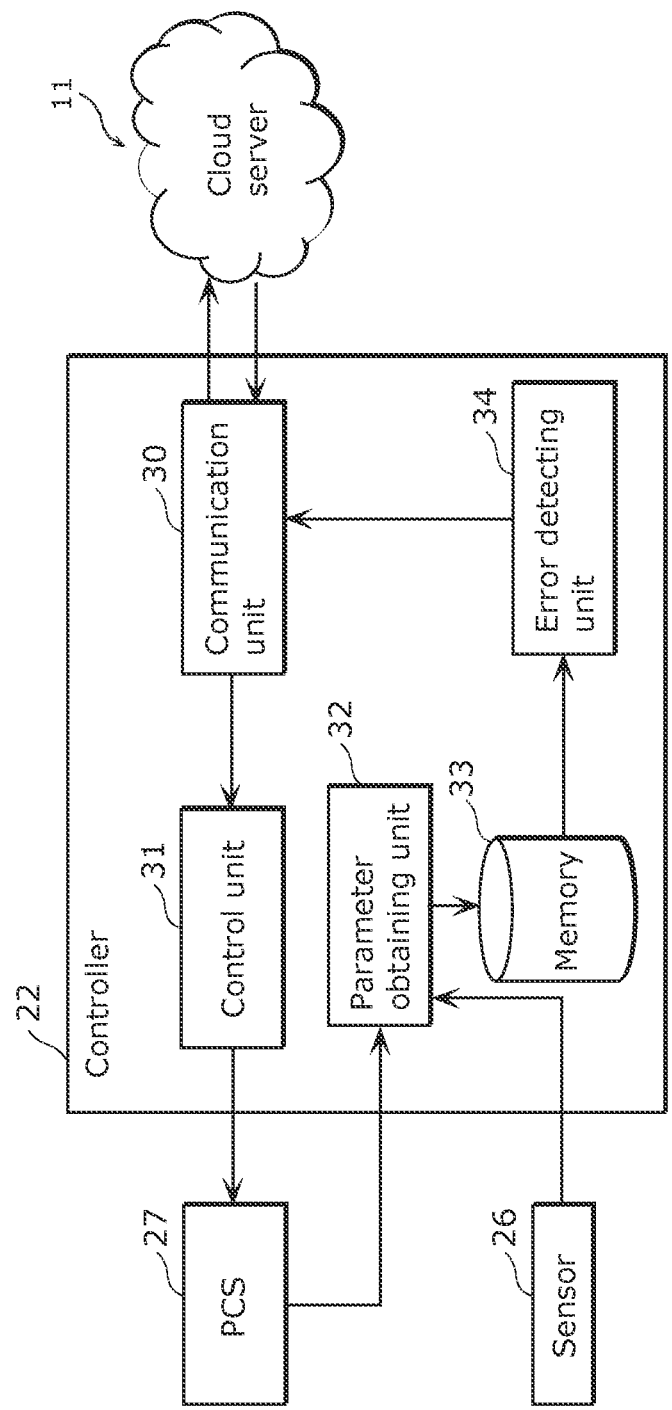
FIG. 12 is a functional block diagram of a controller according to a modification of Embodiment 1.

As shown in FIG. 12, the controller 22 may include an error detecting unit 34 that detects abnormality or malfunction of a storage battery based on the history information accumulated in the memory 33. For instance, the error detecting unit 34 can detect an error by comparing a temperature and voltage characteristics of the storage battery and a standard error model.

Embodiment 2

Figure 13:
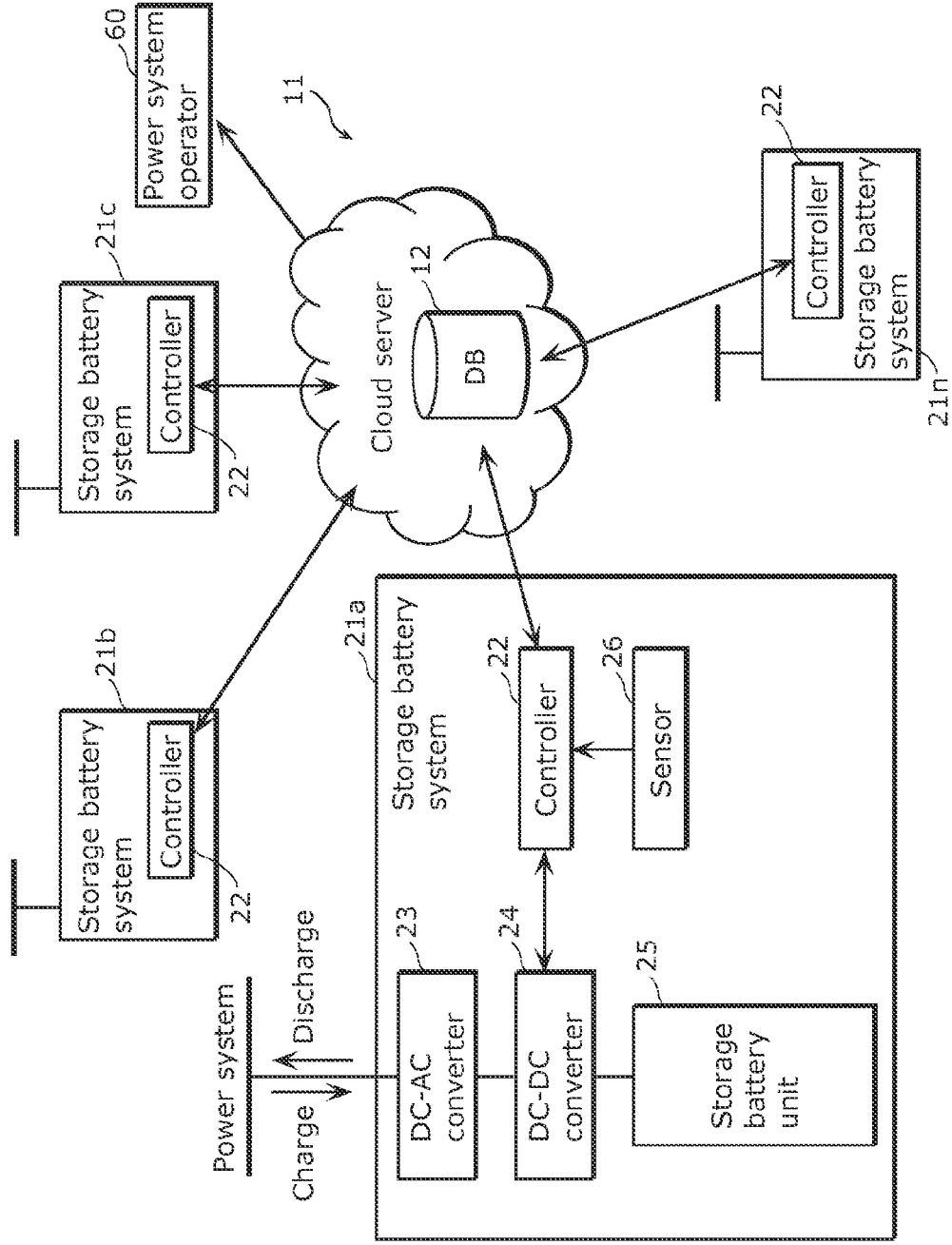
FIG. 13 shows an exemplary system configuration of a storage battery monitoring system according to Embodiment 2.

Embodiment 2 describes a storage battery remote control system when the cloud server 11 is connected to a grid operator 60 as shown in FIG. 13.

The cloud server 11 according to Embodiment 1 remotely controls the charging and discharging of the storage battery systems 21 according to the deterioration states of the respective storage battery systems 21. In Embodiment 2, when receiving, from the grid operator, a control instruction value for regulating a voltage or frequency of a grid, the cloud server 11 further determines an amount of power that each storage battery system 21 is caused to charge or discharge according to the deterioration state of the storage battery system 21.

Moreover, upon receiving the control instruction value from the grid operator 60, the cloud server 11 may determine the storage battery system 21 to be used for the voltage regulation or frequency regulation in the grid, based on efficiency of the DC-AC converter 23. In this case, the cloud server 11 previously obtains charge efficiency or discharge efficiency of the DC-AC converter 23, and stores the charge efficiency or the discharge efficiency into the database 12.

For instance, the cloud server 11 determines a combination of the storage battery systems 21 to be used, to allow the DC-AC converters 23 to have the highest efficiency when the storage battery systems 21 charge or discharge in a range which satisfies the control instruction value.

The cloud server 11 transmits an instruction value for charge and discharge to the controller 22 of the storage battery system 21 to be used for the voltage regulation or frequency regulation in the grid.

It is to be noted that although the case where the efficiency of the DC-AC converter 23 is used has been described as an example above, efficiency of the DC-DC converter 24 may be used instead of the efficiency of the DC-AC converter 23, or the storage battery system 21 may be determined which is to be used for the voltage regulation or frequency regulation in consideration of the efficiency of both the DC-AC converter 23 and the DC-DC converter 24.

It is to be noted that although the present invention has been described based on the above embodiments, the present invention is certainly limited to the embodiments. The present invention includes the following cases.

(1) Each of the above devices can be specifically implemented as a computer system including a microprocessor, a ROM, a RAM, a hard disk unit, a display unit, a keyboard, a mouse, and the like. A computer program is stored in the RAM or the hard disk unit. The microprocessor operates according to the computer program, so that each of the devices carries out its function. Here, the computer program is programmed by combining plural instruction codes each of which indicates an instruction for a computer, to carry out predetermined functions.

(2) Part or all of the structural elements included in each of the devices may be realized as a single system Large Scale Integration (LSI). The system LSI is a super multifunctional LSI manufactured by integrating a plurality of components onto a single chip. Specifically, the system LSI is a computer system including a microprocessor, a ROM, a ROM, and so on. A computer program is stored in the ROM. The microprocessor loads the computer program from the ROM to the RAM and carries out an operation or the like according to the loaded computer program, so that the system LSI carries out its function.

(3) Part or all of the structural elements included in each of the devices may be implemented as an IC card or a stand alone module that can be inserted into and removed from each device. The IC card or the module is a computer system including a microprocessor, a ROM, a RAM, and so on. The IC card or the module may include the aforementioned super multifunctional LSI. The microprocessor operates according to a computer program, so that the IC card or the module carries out its function. The IC card or the module may be tamper resistant.

(4) The present invention may be realized by any of the above-described methods. Moreover, the present invention may be realized by a computer program which causes a computer to execute these methods, or by a digital signal which is composed of the computer program.

Furthermore, the present invention may be realized by a computer program or a digital signal recorded on a computer-readable recording medium such as a flexible disk, a hard disk, a CD-ROM, an MO, a DVD, a DVD-ROM, a DVD-RAM, a Blu-ray Disc (BD), and a semiconductor memory. Also, the present invention may be realized by a digital signal recorded on these recording media.

Moreover, the present invention may be realized by a computer program or a digital signal transmitted via an electric telecommunication line, a wireless or wired communication line, a network represented by the Internet, data broadcasting, and so on.

Furthermore, the present invention may be a computer system including a microprocessor and a memory. The memory may store a computer program, and the microprocessor may operate according to the computer program.

Moreover, by transferring the recording medium having the program or the digital signal recorded thereon or by transferring the program or the digital signal via the network or the like, the present invention may be implemented by a different independent computer system.

(5) The above-described embodiments and modification may be combined with each other.

Although the storage battery system or the like according to one or more aspects has been described above based on the embodiments, the present invention is not limited to the embodiments. Those skilled in the art will readily appreciate that various modifications may be made in the embodiments and that other embodiments may be obtained by combining the structural elements in the different embodiments, without departing from the spirit of the present invention. Accordingly, all such modifications and embodiments may be included in the scope of the one or more aspects.

The present invention is advantageously applied to a storage battery monitoring device which both manages characteristics of a storage battery system and remotely controls a storage battery, a storage battery system, a storage battery monitoring system, and a remote monitoring method for use in a storage battery monitoring device.

REFERENCE SIGNS LIST

11 Cloud server
12 Database (storage unit)
21, 21a, 21b, 21c, 21n Storage battery system
22 Controller
23 DC-AC converter
24 DC-DC converter
25 Storage battery unit
26 Censor
27 PCS
30, 40 Communication unit
31, 100 Control unit
32 Parameter obtaining unit
33 Memory
34 Error detecting unit
42 Deterioration model obtaining unit
43 History information obtaining unit
44 First determining unit
45 Deterioration estimating unit
46 Deterioration model creating unit
47 Error model obtaining unit
48 Second determining unit
49 Error symptom detecting unit
50 Control plan determining unit
60 Grid operator

The invention claimed is:

1. A storage battery monitoring method comprising:
receiving, via a communication network, identification information indicating a storage battery system and characteristic data of at least one storage battery, the storage battery system including the at least one storage battery, the characteristic data including history information which indicates charging and discharging history of the at least one storage battery;

determining, based on the received history information, a deterioration model corresponding to the at least one storage battery from among deterioration models managed in a database, the deterioration models each indicating a relationship between a state of health and a number of charging and discharging cycles performed by the battery as indicated by the charging and discharging history;

generating control data for suppressing deterioration of the at least one storage battery at a predetermined point in time according to the corresponding deterioration model; and transmitting, via the communication network, the generated control data to the storage battery system to cause the storage battery system to control the at least one storage battery based on the transmitted control data, wherein the determining of the deterioration model corresponding to the at least one storage battery includes:

obtaining a deterioration pattern of the at least one storage battery from the history information, the deterioration pattern indicating a relationship between a state of health and a number of charging and discharging of the at least one storage battery, calculating respective similarity levels between the obtained deterioration pattern of the at least one of storage battery and each of the deterioration models managed in the database, and determining, based on the similarity levels, the deterioration model corresponding to the at least one storage battery, and wherein calculating of respective similarity levels includes calculating a sum of residual squares of an SOH of each deterioration model every time charge and discharge are performed a number of times, and a deterioration model having the smallest sum of the residual squares is determined as a deterioration model corresponding to the at least one storage battery.

2. The storage battery monitoring method according to claim 1, wherein the characteristic data further includes at least one selected from output power, a voltage, a temperature, and a state of charge of the at least one storage battery.

3. The storage battery monitoring method according to claim 1, wherein the control data is for decreasing an amount of charge to be returned to the at least one storage battery when charging, in the case where the deterioration model corresponding to the at least one storage battery indicates a state of health less than a predetermined threshold value.

4. The storage battery monitoring method according to claim 1, wherein the control data is for decreasing output power of the at least one storage battery, in the case where the deterioration model corresponding to the at least one storage battery indicates a state of health less than a predetermined threshold value.

5. The storage battery monitoring method according to claim 1, further comprising registering, into the database, a new deterioration model which is created based on the received history information, in the case where the deterioration models managed in the database include no deterioration model similar to a deterioration pattern of the at least one storage battery.

6. The storage battery monitoring method according to claim 1, comprising:

determining, based on the received characteristic data of the at least one storage battery, whether or not the at least one storage battery is in an abnormal state, using error models managed in the database, the error models indicating characteristics of other storage batteries which are in the abnormal state; and transmitting, via the communication network, abnormality information to the storage battery system when the at least one storage battery is in the abnormal state.

7. The storage battery monitoring method according to claim 1, wherein the storage battery system includes a plurality of the storage batteries, the method comprising transmitting the control data about each of the storage batteries.

8. The storage battery monitoring method according to claim 7, wherein the control data is for increasing output power for a less-deteriorated storage battery among the storage batteries and decreasing output power for a more-deteriorated storage battery among the storage batteries.

9. The storage battery monitoring method according to claim 1, wherein the storage battery system is one of a plurality of the storage battery systems, the method comprising:

generating the control data about each of the storage battery systems; and transmitting the control data to each of the storage battery systems.

10. The storage battery monitoring method according to claim 1, wherein the characteristic data include information about a state of health of the at least one storage battery.

11. The storage battery monitoring method according to claim 1, wherein the deterioration models each are determined by a predetermined method.

12. The storage battery monitoring method according to claim 1, wherein the deterioration models each indicate the relationship under a different operating condition of the at least one storage battery.

13. The storage battery monitoring method according to claim 1, wherein the deterioration models each indicate the relationship under a different operation environment of the at least one storage battery.

14. The storage battery monitoring method according to claim 1, wherein the control data for deactivating the at least one storage battery is transmitted in the case where the deterioration model corresponding to the at least one storage battery indicates a state of health less than a predetermined value.

15. A storage battery monitoring system comprising:

a storage on which a database of deterioration models are recorded; and control circuitry configured to execute instruction to receive, via a communication network, identification information indicating storage battery system and characteristic data of at least one storage battery, the storage battery system including the at least one storage battery, the characteristic data including history information which indicates charging and discharging history of the at least one storage battery, determine, based on the received history information, a deterioration model corresponding to the at least one storage battery from among deterioration models managed in a database, the deterioration models each indicating a relationship between a state of health and a number of charging and discharging cycles performed by the battery as indicated by the charging and discharging history, generate control data for suppressing deterioration of the at least one storage battery at a predetermined point in time according to the corresponding deterioration model, and transmit, via the communication network, the generated control data to the storage battery system to cause the storage battery system to control the at least one storage battery based on the transmitted control data, wherein the storage battery monitoring system further configured to:

obtain a deterioration pattern of the at least one storage battery from the history information, the deterioration pattern indicating a relationship between a state of health and a number of charging and discharging of the at least one storage battery, calculate respective similarity levels between the obtained deterioration pattern of the at least one of storage battery and each of the deterioration models managed in the database, and determine, based on the similarity levels, the deterioration model corresponding to the at least one storage battery, and wherein the respective similarity levels are calculated by calculating a sum of residual squares of an SOH of each deterioration model every time charge and discharge are performed a number of times, and a deterioration model having the smallest sum of the residual squares is determined as a deterioration model corresponding to the at least one storage battery.

16. A storage battery system for use in the storage battery monitoring system according to claim 15.

17. The storage battery monitoring system according to claim 15, wherein the control circuitry is configured to execute the instruction to determine the deterioration model corresponding to the at least one storage battery by:

obtaining a deterioration pattern of the at least one storage battery from the history information, the deterioration pattern indicating a relationship between a state of health and a number of charging and discharging of the at least one storage battery; and comparing the obtained deterioration pattern to each of the deterioration models managed in the database.

18. The storage battery monitoring system according to claim 15, wherein the control circuitry is configured to execute the instruction to determine the deterioration model corresponding to the at least one storage battery by:

obtaining a deterioration pattern of the at least one storage battery from the history information, the deterioration pattern indicating a relationship between a state of health and a number of charging and discharging of the at least one storage battery;

calculating respective similarity levels between the obtained deterioration pattern of the at least one of storage battery and each of the deterioration models managed in the database; and determining, based on the similarity levels, the deterioration model corresponding to the at least one storage battery.

19. The storage battery monitoring system according to claim 15, wherein the characteristic data include information about a state of health of the at least one storage battery.

20. The storage battery monitoring system according to claim 15, wherein the control data for deactivating the at least one storage battery is transmitted in the case where the deterioration model corresponding to the at least one storage battery indicates a state of health less than a predetermined value.

21. A storage battery system comprising:

at least one storage battery;

a sensor configured to detect a state of the at least one storage battery; and control circuitry configured to (i) transmit, to a storage battery monitoring system connected via a communication network, identification information indicating the storage battery system and characteristic data of at least one storage battery, the characteristic data including history information which indicates charging and discharging history of the at least one storage battery, (ii) receive, from the storage battery monitoring system via the communication network, control data for suppressing deterioration of the at least one storage battery at a predetermined point in time according to a deterioration model corresponding to the at least one storage battery, and (iii) control the at least one storage battery based on the received control data, wherein the storage battery monitoring system determines, based on the history information, the deterioration model corresponding to the at least one storage battery from among deterioration models managed in a database, the deterioration models each indicating a relationship between a state of health and a number of charging and discharging cycles performed by the battery as indicated by the charging and discharging history, and the control data are for decreasing a voltage applied to the at least one storage battery when the at least storage battery is charging or decreasing a current passing through the at least one storage battery when the at least one storage battery discharging, wherein the storage battery monitoring system is further configured to:

obtain a deterioration pattern of the at least one storage battery from the history information, the deterioration pattern indicating a relationship between a state of health and a number of charging and discharging of the at least one storage battery, calculate respective similarity levels between the obtained deterioration pattern of the at least one of storage battery and each of the deterioration models managed in the database, and determine, based on the similarity levels, the deterioration model corresponding to the at least one storage battery, and wherein the respective similarity levels are calculated by calculating a sum of residual squares of an SOH of each deterioration model every time charge and discharge are performed a number of times, and a deterioration model having the smallest sum of the residual squares is determined as a deterioration model corresponding to the at least one storage battery.

22. The storage battery system according to claim 21, wherein the characteristic data include information about a state of health of the at least one storage battery.

23. The storage battery system according to claim 21, wherein the control data for deactivating the at least one storage battery is transmitted in the case where the deterioration model corresponding to the at least one storage battery indicates a state of health less than a predetermined value.

* * * * *